United States Patent
Watanabe

(10) Patent No.: US 11,693,264 B2
(45) Date of Patent: Jul. 4, 2023

(54) OPTICAL ISOLATOR AND FARADAY ROTATOR

(71) Applicant: Shin-Etsu Chemical Co., Ltd., Tokyo (JP)

(72) Inventor: Toshiaki Watanabe, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 672 days.

(21) Appl. No.: 16/684,599

(22) Filed: Nov. 15, 2019

(65) Prior Publication Data

US 2020/0159046 A1    May 21, 2020

(30) Foreign Application Priority Data

Nov. 16, 2018    (JP) .................. 2018-215398

(51) Int. Cl.

| G02F 1/00 | (2006.01) |
|---|---|
| G04B 35/00 | (2006.01) |
| C04B 35/01 | (2006.01) |
| C04B 35/505 | (2006.01) |
| C30B 29/16 | (2006.01) |
| G02F 1/09 | (2006.01) |
| G02F 1/095 | (2006.01) |
| C04B 35/50 | (2006.01) |
| G02F 1/35 | (2006.01) |

(52) U.S. Cl.
CPC ............ *G02F 1/0036* (2013.01); *C04B 35/01* (2013.01); *C04B 35/50* (2013.01); *C04B 35/505* (2013.01); *C30B 29/16* (2013.01); *G02F 1/093* (2013.01); *G02F 1/0955* (2013.01); *C04B 2235/3225* (2013.01); *G02F 1/3501* (2013.01); *G02F 1/3503* (2021.01); *G02F 1/3505* (2021.01)

(58) Field of Classification Search
CPC ............................. G04B 35/01; G04B 35/00
USPC ........................................... 359/484
See application file for complete search history.

(56) References Cited

U.S. PATENT DOCUMENTS

| 2011/0129180 A1* | 6/2011 | Jiang ..................... C03C 13/046 |
|---|---|---|
| | | 385/11 |
| 2011/0181950 A1 | 7/2011 | Makikawa et al. |
| 2011/0261454 A1* | 10/2011 | Jiang ..................... G02F 1/0955 |
| | | 359/484.03 |
| 2013/0129272 A1* | 5/2013 | Jiang ..................... G02F 1/0955 |
| | | 385/11 |

(Continued)

FOREIGN PATENT DOCUMENTS

| JP | 2011-150208 A | 8/2011 |
|---|---|---|
| JP | 2013095608 A * | 5/2013 |
| RO | 132655 A2 * | 6/2018 |

*Primary Examiner* — Kaveh C Kianni
(74) *Attorney, Agent, or Firm* — Hauptman Ham, LLP

(57) ABSTRACT

A Faraday rotator and an optical isolator having a high transmittance and a high Verdet constant are provided. The optical isolator includes at least a Faraday rotator that rotates a polarization plane of incident light in a non-reciprocal manner, a polarizer disposed on a light incident side of the Faraday rotator, and an analyzer disposed on a light exit side of the Faraday rotator. The Faraday rotator is made of an oxide containing ytterbium oxide ($Yb_2O_3$), and is manufactured by a ceramic manufacturing process, wherein the oxide is allowed to contain an oxide of a metal other than ytterbium, and the proportion of ytterbium in all metal atoms in the oxide is 80% or more.

5 Claims, 2 Drawing Sheets

(56) References Cited

U.S. PATENT DOCUMENTS

2013/0329280 A1\* 12/2013 Jiang .................... G02B 6/2746
359/341.3

\* cited by examiner

OPTICAL ISOLATOR AND FARADAY ROTATOR

CROSS-REFERENCE TO RELATED APPLICATION

This non-provisional application claims priority under U.S.C. § 119(a) from Japanese Patent Application No. 2018-215398, filed on Nov. 16, 2018, the entire contents of which are incorporated herein by reference.

BACKGROUND

Technical Field

The present invention relates to an optical isolator used in optical processing and optical measurement, and a Faraday rotator used therein.

Background Art

In a laser light source used in an optical processing apparatus or an optical measuring apparatus, when the emitted laser light is reflected by a surface of a member provided in a transmission path and the reflected light returns to the laser light source and enters the laser light source, laser oscillation becomes unstable. In order to block such reflected return light, an optical isolator using a Faraday rotator that rotates a polarization plane in a non-reciprocal manner is used.

In recent years, a laser light source (for example, a He—Cd laser (wavelength: 325 nm) or an Ar laser (wavelength: 514 nm)) having a wavelength range of 320 nm to 800 nm has been used in an optical processing apparatus or an optical measuring apparatus. Currently, a Faraday rotator of $Tb_3Ga_5O_{12}$ single crystals (commonly referred to as TGG) has been put into practical use, but since the light absorption by Tb ions occurs in wavelength regions of 320 to 410 nm and 450 to 550 nm, the transmittance of the Faraday rotator of TGG is low in the vicinity of these wavelength regions. In the wavelength regions where the transmittance is low, the optical loss becomes large, and the lost light is converted into heat energy, so that the Faraday rotator is overheated. As a result, temperature changes occur in the Faraday rotator, and problems such as deterioration of the isolation performance may occur. Therefore, it is not preferable to use an optical isolator using TGG for a laser light source having a wavelength range of 320 nm to 800 nm.

On the other hand, since the light absorption by the Yb ions occurs in the vicinity of 915 nm and 975 nm and the light absorption in the wavelength range of 320 nm to 800 nm is small, it is expected that the optical isolator using the Yb-based material as the Faraday rotator is suitable for the laser light source in the wavelength range of 320 nm to 800 nm.

Therefore, the inventors have grown crystals of Yb-based material by the floating zone melt method, and succeeded in growing crystals having a light transmittance of about 90% at a wavelength of 600 nm (see, for example, Japanese Patent Application Laid-Open No. 2011-150208). However, in the floating zone melt method, the transmittance was not improved even if crystals with an increased $Yb_2O_3$ ratio were grown in an attempt to further improve the transmittance.

SUMMARY OF THE INVENTION

Problems to be Solved by the Invention

It is an object of the present invention to provide a Faraday rotator and an optical isolator having a high transmittance and a high Verdet constant.

Means for Solving the Problems

When the inventors examined the growth of crystals having high transmittance, it was found that the $Yb_2O_3$ ratio can be increased by the ceramic manufacturing process, and the transmittance can be improved.

In order to solve the above problems, an optical isolator of the present invention includes at least a Faraday rotator for rotating a polarization plane of incident light in a non-reciprocal manner, a polarizer disposed on a light incident side of the Faraday rotator, and an analyzer disposed on a light exit side of the Faraday rotator. The Faraday rotator is made of an oxide containing ytterbium oxide ($Yb_2O_3$), and is manufactured by a ceramic manufacturing process, wherein the oxide is allowed to contain an oxide of a metal other than ytterbium, and the proportion of ytterbium in all metal atoms in the oxide is 80% or more. With such a configuration, an optical isolator using a Faraday rotator having a high transmittance can be realized.

In the present embodiment, the oxide contains cerium oxide ($CeO_2$) as an oxide of a metal other than ytterbium, and the proportion of cerium in all metal atoms in the oxide is preferably 20% or less. With such a configuration, an optical isolator using a Faraday rotator having a large Verdet constant can be realized.

In the present invention, the Faraday rotator may polarize light having a wavelength in the range of 320 to 800 nm.

In the present invention, the Faraday rotator may be formed in a parallel plate shape having an incident surface and an exit surface. The incident surface may have a first reflection mechanism provided in a substantially half region thereof, and an incident portion for taking the incident light inside at which the first reflection mechanism is not provided. The exit surface may have a second reflection mechanism provided in a region opposed to the incident portion, and an exit portion for exiting light passing through the Faraday rotator at which the second reflection mechanism, is not provided. The Faraday rotator may be arranged such that incident light incident from the incident portion through the polarizer is reflected by the second reflection mechanism and the first reflection mechanism and exit from the exit portion and enters the analyzer.

The Faraday rotator is made of an oxide containing ytterbium oxide ($Yb_2O_3$) and manufactured by a ceramic manufacturing process. The above oxide is allowed to contain an oxide of a metal other than ytterbium, and the proportion of ytterbium in all metal atoms in the oxide is 80% or more. With such a configuration, a Faraday rotator having a high transmittance can be obtained.

In the present embodiment, the oxide contains cerium oxide ($CeO_2$) as an oxide of a metal other than ytterbium, and the proportion of cerium in all metal atoms in the oxide is preferably 20% or less. In this manner, a Faraday rotator having a large Verdet constant can be obtained.

In the present invention, the Faraday rotator may polarize light having a wavelength in the range of 320 to 800 nm.

DETAILED DESCRIPTION OF THE EMBODIMENTS

Hereinafter, embodiments of the present invention will be described in detail, but the present invention is not limited thereto.

Figure 1:
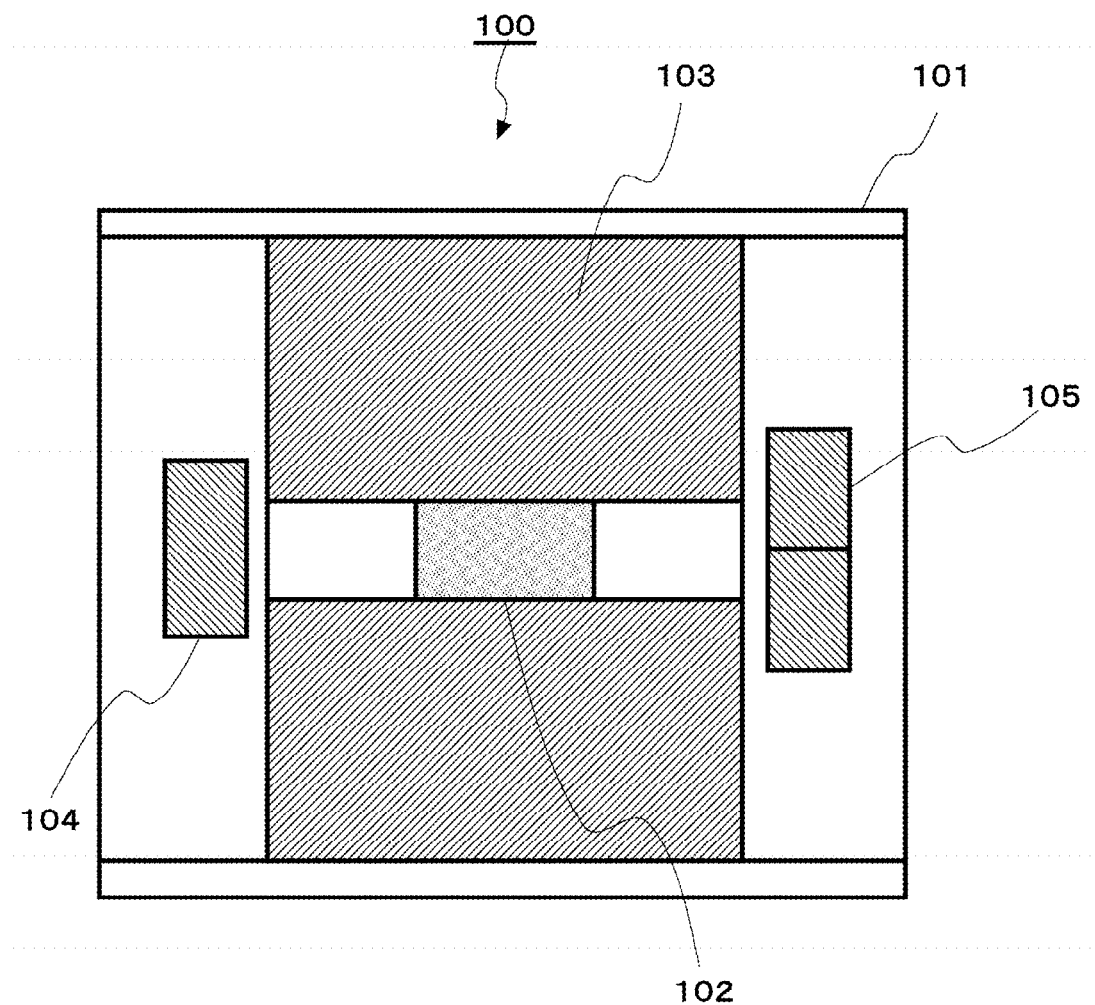
FIG. 1 is a diagram showing a basic configuration of an optical isolator.

An optical isolator is an optical component that transmits only light traveling in one direction (forward direction) and blocks light in the opposite direction. The optical isolator 100 of the present embodiment uses a Faraday rotator that rotates the polarization plane in a non-reciprocal manner. As shown in FIG. 1, inside the housing 101, a polarizer 104 and an analyzer 105 are arranged at both ends of the Faraday rotator 102. The polarization oscillation plane of the polarizer 104 and the polarization oscillation plane of the analyzer 105 are arranged so that the relative angle is 45°. A magnet 103 for applying a magnetic field to the Faraday rotator 102 is disposed around the Faraday rotator 102.

The Faraday rotator rotates the polarization plane when it transmits linearly polarized light in a traveling direction parallel to the magnetic field. Here, the angle θ at which the Faraday rotator rotates the polarization plane is expressed by the following equation (1).

$$\theta = V \times H \times L \tag{1}$$

Note that V is called a Verdet constant, and represents the magnitude of rotation of the polarization plane of linearly polarized light. The Verdet constant is determined by the material of the Faraday rotator and the measured wavelength. H is the magnitude of the magnetic field, and L is the length of the Faraday rotator (optical path length at the time of transmission). The larger the Verdet constant, the shorter the length of the Faraday rotator required to obtain the same rotation angle.

Laser light having a wavelength in the range of 320 to 800 nm enters the optical isolator 100 shown in FIG. 1 in the forward direction. The light incident in the forward direction is linearly polarized by the polarizer 104, and is incident on the Faraday rotator 102. Subsequently, the polarization plane of the light is rotated by 45° by the Faraday rotator 102, and is incident on the analyzer 105. Since the polarization oscillation plane of the polarizer 104 and the polarization oscillation plane of the analyzer 105 have a relative angle of 45°, light is emitted as it is.

On the other hand, for light incident from the opposite direction, polarized light that can pass through the analyzer 105 enters the Faraday rotator 102. In the Faraday rotator 102, the polarization plane of the light rotates 45 degrees in the direction opposite to the direction of rotation in the forward direction with respect to the traveling direction. Here, since the polarization plane of the light reaching the polarizer 104 is at an angle of 90° with respect to the polarization oscillation plane of the polarizer 104, the light incident from the opposite direction cannot pass through the optical isolator 100. With such a configuration, the optical isolator 100 can transmit only the light traveling in one direction (forward direction) and block the light in the opposite direction.

The Faraday rotator 102 used in the optical isolator 100 of the present embodiment is made of an oxide containing 80 mol % or more of 3 oxide ($Yb_2O_3$). That is, this oxide is allowed to contain an oxide of a metal different from ytterbium, but the ratio of ytterbium to all metal atoms in the oxide is 80% or more. By doing so, the transmittance can be set to 90% or more in the wavelength region of the laser light to be used.

In addition, the Faraday rotator 102 is desirably made of an oxide containing not more than 20 mol % of cerium oxide ($CeO_2$) in a molar ratio (mole fraction) calculated as a $2CeO_2$ so as to equalize the number of Yb atoms and the number of Ce atoms, in addition to containing not less than 80 mol % of ytterbium oxide ($Yb_2O_3$) in the Faraday rotator 102. That is, when the oxide contains $CeO_2$ as an oxide of a metal other than ytterbium, the proportion of cerium in all metal atoms in the oxide is preferably 20% or less. By doing so, the Verdet constant can be increased in the wavelength range of the laser light to be used.

The oxide forming the Faraday rotator 102 as described above can be produced by a ceramic manufacturing method.

Figure 2:
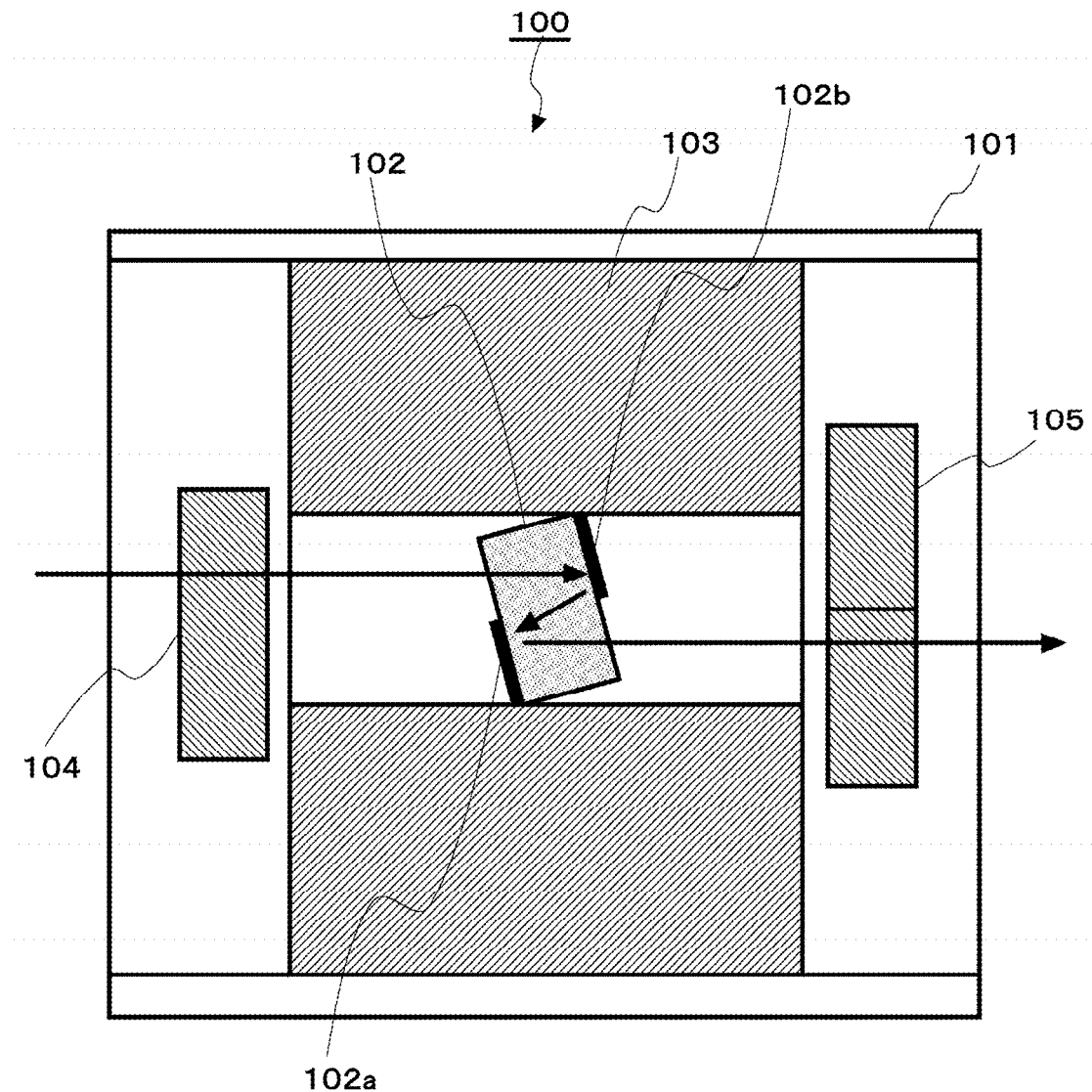
FIG. 2 is a diagram showing a method of arranging a Faraday rotator in an optical isolator together with an optical path.

In the optical isolator 100 of the present embodiment, it is desirable to use, as the Faraday rotator 102, a transparent workpiece made of an oxide containing ytterbium oxide ($Yb_2O_3$) as described above and processed into a parallel-flat plate shape and provided with reflecting mechanisms (102a, 102b) at each half of both ends of the transparent workpiece. As shown in FIG. 2, the transparent workpiece provided with the reflection mechanisms 102a and 102b is inclined so that the incident light is emitted in one and a half round trips. With such a configuration, the optical path length in the Faraday rotator can be extended without increasing the length (thickness) of the Faraday rotator 102, and the Faraday rotator and the optical isolator can be miniaturized.

Hereinafter, examples will be described in order to clarify a composition ratio of an oxide suitable for use as the Faraday rotator 102.

EXAMPLE 1

Transparent workpieces each containing ytterbium oxide ($Yb_2O_3$) and yttrium oxide ($Y_2O_3$) in eight molar ratios shown in Table 1 were prepared by the procedures described below, and their characteristics were evaluated. First, ytterbium oxide ($Yb_2O_3$) having a purity of 3N or more and yttrium oxide ($Y_2O_3$) having a purity of 4N or more were mixed in a ball mill at predetermined molar ratios. Thereafter, calcination was performed in an alumina crucible at 1100° C. for 3 hours to prepare a calcined body of the oxide raw material. Subsequently, the prepared calcined body was mixed by a ball mill using a nylon pot and a nylon ball to obtain a mixed powder. This mixed powder was put in a mold, molded by a cold isostatic pressing method (CIP), and the molded body was subjected to main firing. In the main firing, after the temperature was raised to 600° C. at a temperature raising rate of 100° C./h and held for 10 hours, the temperature was raised to 1400° C. at the same temperature raising rate and held for 2 hours. Thereafter, the molded body was held at a firing temperature of 1600° C. for 4 hours in a vacuum furnace, and was allowed to drop to room temperature. In this manner, a transparent workpiece having eight different composition ratios shown in Table 1 was obtained.

Thereafter, both end surfaces of the prepared transparent workpiece were mirror-polished with diamond slurry to obtain a thickness of 2 mm. In addition, an anti-reflection film (AR) coating against air corresponding to a predetermined wavelength (405 nm, 514 nm, 633 nm) of the laser beam shown in Table 1 was applied, and the transmittance and Verdet constant of the transparent workpiece were measured. The evaluation measurement results of Example 1 are shown in Table 1.

TABLE 1

| Light wavelength (nm) | | Raw composition ratio | | | | | | | |
|---|---|---|---|---|---|---|---|---|---|
| | | $Yb_2O_3:Y_2O_3$ | $Yb_2O_3:Y_2O_3$ | $Yb_2O_3:Y_2O_3$ | $Yb_2O_3:Y_2O_3$ | $Yb_2O_3:Y_2O_3$ | $Yb_2O_3:Y_2O_3$ | $Yb_2O_3:Y_2O_3$ | $Yb_2O_3:Y_2O_3$ |
| | | molar ratio | | | | | | | |
| | | 50:50 | 60:40 | 70:30 | 75:25 | 80:20 | 85:15 | 90:10 | 100:0 |
| 405 nm | Verdet constant (min/Oe · cm) | 0.379 | 0.450 | 0.520 | 0.555 | 0.590 | 0.620 | 0.663 | 0.734 |
| | transmittance (%) | 86 | 86 | 88 | 89 | 95 | 95 | 94 | 94 |
| 514 nm | Verdet constant (min/Oe · cm) | 0.260 | 0.304 | 0.348 | 0.370 | 0.390 | 0.415 | 0.436 | 0.480 |
| | transmittance (%) | 87 | 87 | 88 | 89 | 94 | 95 | 96 | 95 |
| 633 nm | Verdet constant (min/Oe · cm) | 0.125 | 0.140 | 0.160 | 0.177 | 1.86 | 0.190 | 0.195 | 0.212 |
| | transmittance (%) | 87 | 87 | 89 | 89 | 96 | 96 | 96 | 95 |

As shown in Table 1, it was found that the transparent workpiece produced by adding $Y_2O_3$ to $Yb_2O_3$ had a transmittance of 90% or more at a composition ratio containing 80 mol % or more of $Yb_2O_3$ (i.e., the ratio of ytterbium to all metallic atoms in the oxide was 80% or more).

EXAMPLE 2

Transparent workpieces each containing ytterbium oxide ($Yb_2O_3$) and gadolinium oxide ($Gd_2O_3$) at six molar ratios shown in Table 2 were prepared and their characteristics were evaluated. Preparation of the transparent workpieces and evaluation measurement thereof were performed in the same manner as in the first embodiment by replacing the $Y_2O_3$ with $Gd_2O_3$. The measurement results of Example 2 are shown in Table 2.

TABLE 2

| Light wavelength (nm) | | Raw compostion ratio | | | | | |
|---|---|---|---|---|---|---|---|
| | | $Yb_2O_3:Gd_2O_3$ | $Yb_2O_3:Gd_2O_3$ | $Yb_2O_3:Gd_2O_3$ | $Yb_2O_3:Gd_2O_3$ | $Yb_2O_3:Gd_2O_3$ | $Yb_2O_3:Gd_2O_2$ |
| | | molar ratio | | | | | |
| | | 70:30 | 75:25 | 80:20 | 85:15 | 90:10 | 100:0 |
| 405 nm | Verdet constant (min/Oe · cm) | 0.515 | 0.550 | 0.580 | 0.610 | 0.655 | 0.734 |
| | transmittance (%) | 87 | 87 | 84 | 91 | 93 | 94 |
| 514 nm | Verdet constant (min/Oe · cm) | 0.340 | 0.360 | 0.380 | 0.410 | 0.430 | 0.480 |
| | transmittance (%) | 86 | 88 | 93 | 94 | 95 | 95 |
| 633 nm | Verdet constant (min/Oe · cm) | 0.156 | 0.174 | 0.180 | 0.187 | 0.190 | 0.212 |
| | transmittance (%) | 88 | 88 | 95 | 95 | 95 | 95 |

As shown in Table 2, it was found that the transparent workpiece produced by adding $Gd_2O_3$ to $Yb_2O_3$ had a transmittance of 90% or more at a composition ratio containing 80 mol % or more of $Yb_2O_3$ (i.e., the ratio of ytterbium to all metallic atoms in the oxide was 80% or more).

EXAMPLE 3

Transparent workpieces each containing ytterbium oxide ($Yb_2O_3$) and lanthanum oxide ($La_2O_3$) at six molar ratios shown in Table 3 were prepared and their characteristics were evaluated. Preparation of the transparent workpieces and evaluation measurement thereof were performed in the same manner as in the first embodiment by replacing the $Y_2O_3$ with $La_2O_3$. The measurement results of Example 3 are shown in Table 3.

TABLE 3

| Light wavelength (nm) | | Raw composition ratio | | | | | |
|---|---|---|---|---|---|---|---|
| | | $Yb_2O_3:La_2O_3$ | $Yb_2O_3:La_2O_3$ | $Yb_2O_3:La_2O_3$ | $Yb_2O_3:La_2O_3$ | $Yb_2O_3:La_2O_3$ | $Yb_2O_3:La_2O_3$ |
| | | | | molar ratio | | | |
| | | 70:30 | 75:25 | 80:20 | 85:15 | 90:10 | 100:0 |
| 405 nm | Verdet constant (min/Oe · cm) | 0.510 | 0.545 | 0.570 | 0.605 | 0.645 | 0.734 |
| | transmittance (%) | 84 | 86 | 93 | 93 | 92 | 94 |
| 514 nm | Verdet constant (min/Oe · cm) | 0.335 | 0.360 | 0.375 | 0.400 | 0.425 | 0.480 |
| | transmittance (%) | 84 | 86 | 94 | 95 | 96 | 95 |
| 633 nm | Verdet constant (min/Oe · cm) | 0.145 | 0.165 | 0.175 | 0.178 | 0.180 | 0.212 |
| | transmittance (%) | 87 | 87 | 94 | 93 | 94 | 95 |

As shown in Table 3, it was found that the transparent workpiece produced by adding $La_2O_3$ to $Yb_2O_3$ had a transmittance of 90% or more at a composition ratio containing 80 mol % or more of $Yb_2O_3$ (i.e., the ratio of ytterbium to all metallic atoms in the oxide was 80% or more).

EXAMPLE 4

Transparent workpieces each containing ytterbium oxide ($Yb_2O_3$) and cerium oxide ($CeO_2$) at six molar ratios shown in Table 4 were prepared and their characteristics were evaluated. The molar ratio shown in Table 4 is a molar ratio calculated as $2CeO_2$ instead of $CeO_2$ in order to make the number of Yb atoms and the number of Ce atoms uniform. That is, this molar ratio represents the ratio of the number of atoms of ytterbium and cerium in the oxide. Preparation of the transparent workpieces and evaluation measurement thereof were performed in the same manner as in the first embodiment by replacing the $Y_2O_3$ with $CeO_2$. The measurement results of Example 4 are shown in Table 4.

preferably 80% or more (the proportion of ytterbium contains 80 mol % or more of $Yb_2O_3$).

In addition, comparing the results of Examples 1 to 4, it was found that the Verdet constant of the transparent workpiece produced by adding $CeO_2$ to $Yb_2O_3$ was generally larger than that of the transparent workpiece produced by adding $Y_2O_3$. $Gd_2O_3$ or $La_2O_3$ to $Yb_2O_3$, and the Verdet constant also increased as the ratio of cerium atoms to all metal atoms in the oxide (molar ratio of $2CeO_2$) increased. From these results, it was found that $CeO_2$ is preferably added to the $Yb_2O_3$, and when the cerium atom ratio of all the metal atoms in the oxide at this time is 20% or less, that is, when $2CeO_2$ is 20 mol % or less, the Verdet constants are large and the transmittance is high.

EXAMPLE 5

A transparent workpiece having a composition ratio of 100 mol % of the $Yb_2O_3$ produced in Embodiment 1 was subjected to predetermined processing to evaluate whether the workpiece functions as an optical isolator.

TABLE 4

| Light wavelength (nm) | | Raw composition ratio | | | | | |
|---|---|---|---|---|---|---|---|
| | | $Yb_2O_3:2CeO_2$ | $Yb_2O_3:2CeO_2$ | $Yb_2O_3:2CeO_2$ | $Yb_2O_3:2CeO_2$ | $Yb_2O_3:2CeO_2$ | $Yb_2O_3:2CeO_2$ |
| | | | | molar ratio | | | |
| | | 70:30 | 75:25 | 80:20 | 85:15 | 90:10 | 100:0 |
| 405 nm | Verdet constant (min/Oe · cm) | 1.590 | 1.400 | 1.300 | 1.140 | 1.020 | 0.734 |
| | transmittance (%) | 68 | 74 | 90 | 92 | 92 | 94 |
| 514 nm | Verdet constant (min/Oe · cm) | 1.150 | 0.920 | 0.830 | 0.740 | 0.650 | 0.480 |
| | transmittance (%) | 81 | 83 | 92 | 94 | 96 | 95 |
| 633 nm | Verdet constant (min/Oe · cm) | 0.440 | 0.400 | 0.370 | 0.330 | 0.290 | 0.212 |
| | transmittance (%) | 82 | 84 | 93 | 93 | 94 | 95 |

As shown in Table 4, it was found that the transparent workpiece produced by adding $CeO_2$ to $Yb_2O_3$ had a transmittance of 90% or more at a composition ratio containing 80 mol % or more of $Yb_2O_3$ (i.e., the ratio of ytterbium to all metallic atoms in the oxide was 80% or more). In addition, it was found that the higher the composition ratio of the $CeO_2$, the larger the Verdet constant although the transmittance slightly decreases.

As a whole of Examples 1 to 4, it was found that the transparent workpiece used in the Faraday rotator is preferably produced by a ceramic manufacturing method, and the proportion of ytterbium in all metallic atoms in the oxide is First, the transparent workpiece of the configuration ratio of the $Yb_2O_3$ produced in the first embodiment 100 mol % was processed in a disk shape with an outer diameter of 3.0 mm and thickness of 2 mm, and a 405 nm of AR coating against air was applied. Then, the reflection mirror A was formed on the upper half of one end of the disk-like transparent workpiece to which the AR coating against air was applied, and the reflection mirror B was formed on the lower half of the other end, and by tilting the transparent workpiece, the incident light was adjusted so as to be emitted in one and a half round trips.

Nd—Fe—B magnets (outer diameter of 15 mm, inner diameter of 3.0 mm, and length of 6 mm) were arranged on the outer periphery, and polarizers bonded and fixed to holders were arranged at both ends of the Faraday rotator so as to have relative angles of 45°.

A SUS304 housing was arranged on the outer periphery, and the magnetic part built in the Faraday rotator and the polarizer holder were fixed thereto, and the outer shape was made to be outer diameter of 20 mm and length of 10 mm. The optical isolator thus constructed exhibited good characteristics of insertion loss of 0.6 dB and isolation of 38 dB at 405 nm.

The embodiments of the present invention have been described above, but the present invention is not limited to these examples. In addition, as long as the gist of the present invention is provided, a person skilled in the art may appropriately add, delete, or change the design of the constituent elements or appropriately combine the features of each embodiment with respect to the above-described embodiment, and the present invention is included in the scope of the present invention.

What is claimed is:

1. An optical isolator comprising:
   at least a Faraday rotator that rotates a polarization plane of incident light in a non-reciprocal manner;
   a polarizer disposed on a light incident side of the Faraday rotator; and
   an analyzer disposed on a light exit side of the Faraday rotator,
   wherein the Faraday rotator is made of an oxide containing ytterbium oxide ($Yb_2O_3$), the Faraday rotator being manufactured by a ceramic manufacturing process, and
   wherein the oxide contains cerium oxide ($CeO_2$) as an oxide of a metal other than ytterbium, and the proportion of cerium in all metal atoms in the oxide is 20% or less.

2. The optical isolator as claimed in claim 1, wherein the oxide contains cerium oxide ($CeO_2$) as an oxide of a metal other than ytterbium, and the proportion of cerium in all metal atoms in the oxide is 20% or less.

3. The optical isolator according to claim 1, wherein the Faraday rotator polarize light having a wavelength in the range of 320 to 800 nm.

4. The optical isolator according to claim 1, wherein the Faraday rotator is formed in a parallel plate shape having an incident surface and an exit surface,
   and wherein the incident surface has a first reflection mechanism provided in a substantially half region thereof, and an incident portion for taking the incident light inside at which the first reflection mechanism is not provided,
   and wherein the exit surface has a second reflection mechanism provided in a region opposed to the incident portion, and an exit portion for exiting light passing through the Faraday rotator at which the second reflection mechanism, is not provided, and wherein the Faraday rotator is arranged so that incident light incident from the incident portion through the polarizer is reflected by the second reflection mechanism and the first reflection mechanism, exits from the exit portion, and enters the analyzer.

5. A Faraday rotator consists of an oxide containing ytterbium oxide ($Yb_2O_3$) and manufactured by a ceramic manufacturing process, wherein the oxide is allowed to contain an oxide of a metal other than ytterbium, and the proportion of ytterbium in all metal atoms in the oxide is 80% or more,
   wherein the oxide contains cerium oxide ($CeO_2$) as an oxide of a metal other than ytterbium, and the proportion of cerium in all metal atoms in the oxide is 20% or less.

* * * * *